United States Patent
Manabe

(10) Patent No.: US 7,611,947 B2
(45) Date of Patent: Nov. 3, 2009

(54) METHOD OF MANUFACTURING SEMICONDUCTOR DEVICE

(75) Inventor: Kazutaka Manabe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/076,952

(22) Filed: Mar. 25, 2008

(65) Prior Publication Data
US 2009/0053880 A1 Feb. 26, 2009

(30) Foreign Application Priority Data
Mar. 28, 2007 (JP) .............................. 2007-085852

(51) Int. Cl.
*H01L 21/336* (2006.01)
(52) U.S. Cl. ........................ 438/258; 438/232; 438/259; 438/270; 257/E21.147; 257/E21.384; 257/E21.421
(58) Field of Classification Search ................. 438/206, 438/209, 353, 369, 372, 420, 548; 257/E21.051, 257/E21.061, E21.147, E21.37, E21.4, E21.419, 257/E21.421, E21.428
See application file for complete search history.

(56) References Cited

U.S. PATENT DOCUMENTS

2005/0263843 A1 * 12/2005 Sakakibara ................. 257/500

2008/0173943 A1 * 7/2008 Kang ........................ 257/347

FOREIGN PATENT DOCUMENTS

| JP | 11-17024 | 1/1999 |
| JP | 2001-332634 | 11/2001 |
| JP | 2004-281746 | 10/2004 |

* cited by examiner

*Primary Examiner*—Savitri Mulpuri
*Assistant Examiner*—Cheung Lee
(74) *Attorney, Agent, or Firm*—McGinn IP Law Group, PLLC

(57) ABSTRACT

A method of manufacturing a semiconductor device of the present invention consists of forming a trench in a trench-type cell transistor region; forming a gate insulating film and a gate material layer on a semiconductor substrate; forming a photoresist layer on the semiconductor substrate so as to expose extension region formation portions of the trench-type cell transistor region and a high breakdown voltage transistor region; forming extension regions in each region by performing ion implantation in the semiconductor substrate surface of the trench-type cell transistor region and the high breakdown voltage transistor region and then patterning gates, and forming extension regions of an ordinary breakdown voltage transistor by covering the trench-type cell transistor region and the high breakdown voltage transistor region with a photoresist layer and implanting ions in the ordinary breakdown voltage transistor region.

3 Claims, 6 Drawing Sheets

US 7,611,947 B2

METHOD OF MANUFACTURING SEMICONDUCTOR DEVICE

BACKGROUND OF THE INVENTION

1. Field of the Invention

The present invention relates to a method for forming extension regions of each transistor in a semiconductor device that has a trench-type transistor and a planar-type transistor on a semiconductor substrate.

Priority is claimed on Japanese Patent Application No. 2007-85852, filed Mar. 28, 2007, the content of which is incorporated herein by reference.

2. Description of Related Art

For example, in a peripheral circuit transistor in a dynamic random access memory (DRAM), there are cases that require an N-channel MOS (NMOS) transistor with a high breakdown voltage compared to an ordinary NMOS transistor in some circuits. In this case, forming extension regions of a cell transistor and a high breakdown voltage NMOS transistor in the same photolithography step is one of the common methods.

However, in an N-region formation method for the case of adopting a trench-type transistor as the cell transistor, shifting of the registration positions of the trench and the gate pattern occurs. Therefore, it is preferred to form the extension regions by forming a gate material film and implanting ions from above the gate material film instead of forming the extension regions by the self-alignment method with respect to the gate edge. In that case, there is the advantage of being able to implant ions to the channel region of a trench-type transistor in the same photolithography step.

However, in the case of employing this method, it is impossible to form the extension regions of the aforementioned trench-type cell transistor and the high breakdown voltage NMOS transistor in the same photolithography step. Accordingly, it is necessary to provide a separate photolithography step for forming the extension region of the high breakdown voltage NMOS transistor, which leads to the problem of a cost increase.

The above situation will be described in reference to FIG. 3 to FIG. 5. Note that for the purpose of simplification, each single transistor in a trench-type cell transistor region, a high breakdown voltage NMOS transistor region, and an ordinary NMOS region that does not withstand a high voltage is illustrated as being adjoined, while a P-channel MOS (PMOS) region that is generally considered to exist is not illustrated. Also, since an upper insulating film, contact, and upper wiring and the like are formed by a general approach, the explanation is given without illustrating them for the purposes of simplification.

Element isolation regions 102, 103, 104, 105 are formed on a semiconductor substrate 101 as shown in FIG. 3, and each element is separately insulated. Here, from the left are shown a trench-type cell transistor region 106, a high breakdown voltage NMOS region 107, and an ordinary NMOS region 108 that does not withstand a high voltage. Next, a trench portion 113 for constituting the trench-type transistor is formed in the trench-type cell transistor region 106 using photolithography and dry etching technology so as to be sandwiched by the element isolation regions 102, 103.

Then, a gate insulating film 110 is formed by a general oxidation method on the surface of the semiconductor substrate 101 including the interior of the trench portion 113. Moreover, a gate material layer 111 is formed by the chemical vapor deposition (CVD) film forming method or the like on the gate insulating film 110. The gate material layer 111 is filled in the trench portion 113 via the gate insulating film 110.

From this state, after covering a region excluding the trench-type cell transistor region 106 with a photoresist film 117 as shown in FIG. 3, ions are implanted from above the substrate in the trench-type cell transistor region 106 as shown by the arrows A. Thereby, an N-type diffusion layer 118 is formed on both side portions of the trench portion 113 in the region between the element isolation regions 102, 103.

Next, the gate material layer 111 is patterned into the target shape using photolithography technology after removing the photoresist film 117 as shown in FIG. 4. That is, a gate electrode 120 is formed in the trench-type cell transistor region 106, a gate electrode 121 is formed in the high breakdown voltage NMOS region 107, and a gate electrode 122 is formed in the ordinary NMOS region 108. Next, the trench-type cell transistor region 106 and the high breakdown voltage NMOS region 107 are covered by a photoresist film 123, and ion injection is performed from above the substrate into the ordinary NMOS region 108 as shown by the arrows B. Thereby, an N$^-$ diffusion layer 125 is formed on the surface portion of the semiconductor substrate 101 on both sides of the gate electrode 122, and an ordinary breakdown voltage type NMOS transistor portion 126 is formed. Note that when forming the N$^-$ diffusion layer 125, generally a P-type diffusion layer region 125a is often formed by Halo (Pocket) implantation.

Next, after removing the photoresist film 123 as shown in FIG. 5, the trench-type cell transistor region 106 and the ordinary NMOS region 108 on the substrate are covered by a photoresist film 127. Next, ion implantation is performed from above the substrate as shown by the arrows C, and N$^-$ diffusion layers 129 are formed. In this manner, a high breakdown voltage NMOS transistor portion 130 of the high breakdown voltage NMOS region 107 is formed.

Thereafter, although not illustrated, a sidewall is formed on the gate side walls, and N$^+$ diffusion layers are formed on the source/drain of the NMOS regions other than the trench-type cell transistor.

According to the steps shown in FIG. 3 to FIG. 5, the extension regions of the trench-type cell transistor region 106 and the high breakdown voltage NMOS region 107 cannot be formed in the same step. Accordingly, a photolithography step is separately required to form the extension regions of the high breakdown voltage NMOS region 107, that is, the N$^-$ diffusion layers 129, as shown in FIG. 5, which leads to an increase in the manufacturing cost.

Japanese Unexamined Patent Application, First Publication, (JP-A) No. 2004-281746 discloses a method that can reduce the number of steps in manufacturing a CMOS transistor structure that is provided with an NMOS transistor and a PMOS transistor. This method is used for forming a first and second semiconductor device by forming a first and second semiconductor thin film on a substrate and injecting an impurity in at least the first semiconductor thin film. That is, in this method, a metal film for forming an electrode is formed on the first and second semiconductor thin films, and an impurity injection mask is formed by patterning that covers an electrode of a first semiconductor element and the semiconductor thin film of the second semiconductor element. After injecting a first conductive type impurity in the first semiconductor thin film, an electrode of a second semiconductor element is formed by again patterning an impurity injection mask that covers the second semiconductor thin film. Then, a second conductive type impurity is injected in the first and second semiconductor thin films in low concentration with this electrode used as a mask.

Also, with the object of avoiding a drop in production yield due to junction leakage current, Japanese Unexamined Patent Application, First Publication, (JP-A) No. 2000-332634 discloses performing ion implantation via a photoresist layer in an N-type MOSFET (NMOSFET) region in order to form a lightly doped drain (LDD) region of the NMOSFET region. Specifically, ion implantation is performed simultaneously to a peripheral region of an element isolation layer of an NMOSFET region of a static random access memory (SRAM) circuit, and an auxiliary implantation region is formed. Consequently, a source/drain diffusion layer can be thickened in the vicinity of the element isolation layer.

Furthermore, Japanese Unexamined Patent Application, First Publication, (JP-A) No. H11-17024 discloses a method of manufacturing a semiconductor device having an NMOS transistor having an N-type gate electrode, and a PMOS transistor having a P-type gate electrode on the same substrate. This method consists of implanting impurity ions in each region to be removed by an etching process in a gate electrode film formed on a semiconductor substrate via a gate insulating film, so that the impurity compositions of the regions are equal or nearly equal, and then removing regions to be removed by etching to form gate electrodes of a predetermined pattern.

In the steps shown in FIG. 3 to FIG. 5 described above, the step of implanting ions in the trench-type transistor that is provided in the trench-type cell transistor region 106, the step of implanting ions in the high breakdown voltage transistor provided in the high breakdown voltage NMOS region 107, and the step of implanting ions in the transistor provided in the ordinary NMOS region are respectively performed by individual photolithography steps. For that reason, a photolithography step is separately required to provide a photoresist film for the step of implanting ions in the high breakdown voltage NMOS region compared to conventional methods, leading to the problem of a higher manufacturing cost due to the increased number of steps.

Also, even when applying the technology disclosed in the patent documents described above, no contribution is made to a simplification of the manufacturing procedures described based on the aforementioned FIG. 3 to FIG. 5.

SUMMARY OF THE INVENTION

The present invention was achieved in view of the above circumstances, and has as its object to provide a method that can perform an ion implantation step in extension regions of a trench-type cell transistor and a high breakdown voltage NMOS transistor in the same photolithography step without making the positional relation of the gate edge of the high breakdown voltage NMOS transistor and the extension region that is formed by ion implantation in the high breakdown voltage NMOS transistor a self-aligning structure, and prevent an increase in manufacturing cost by achieving a simplification of processes.

In order to solve the aforementioned issues, a method of manufacturing a semiconductor device or the present invention is a method of manufacturing a semiconductor device in which a trench-type transistor, a high breakdown voltage transistor, and an ordinary breakdown voltage transistor are provided on a semiconductor substrate, including the steps of: forming element isolation layers on a surface of a semiconductor substrate for isolating a trench-type transistor, a high breakdown voltage transistor, and an ordinary breakdown voltage transistor; forming a trench in a trench-type transistor region; forming a gate insulating film and a gate material layer on the semiconductor substrate and in the trench; forming a first photoresist layer on the semiconductor substrate so as to expose extension region formation portions of the trench-type transistor region and the high breakdown voltage transistor region; forming extension regions of the trench-type transistor and the high breakdown voltage transistor by performing ion implantation in the trench-type transistor region and the high breakdown voltage transistor region; forming a second photoresist layer on the semiconductor substrate so as to cover the trench-type transistor region and the high breakdown voltage transistor region and expose the ordinary breakdown voltage transistor region; and forming extension regions of the ordinary breakdown voltage transistor by implanting ions in the ordinary breakdown voltage transistor region.

In the present invention, it is preferred to perform ion implantation in the extension region formation portions after covering the ordinary breakdown voltage transistor region and a channel portion of the high breakdown voltage transistor region with a photoresist layer.

In the present invention, it is preferable to make the gate insulating film and the gate material layer into a target shape after forming the extension regions in the trench-type transistor region and the high breakdown voltage transistor region.

According to the present invention, in the case of forming a high breakdown voltage transistor in a high breakdown voltage transistor region, a photoresist layer is formed on a semiconductor substrate so as to expose extension region formation portions of the trench-type transistor region and the high breakdown voltage transistor region without making the positional relation of the gate edge and extension regions a self-aligning structure. Accordingly, when implanting ions in the extension regions of the trench-type transistor region, it is possible to implant ions in the extension regions of the high breakdown voltage transistor region as well. Thereby, it is possible to eliminate a photolithography step by a photolithography method in the case of using the self-alignment structure, and possible to achieve a simplification of steps. Accordingly, this contributes to a reduction in manufacturing cost of a semiconductor device.

PREFERRED EMBODIMENTS OF THE INVENTION

Hereinbelow, a semiconductor device and a method of manufacturing the same according to an embodiment of the present invention shall be described with reference to the drawings.

Figure 1:
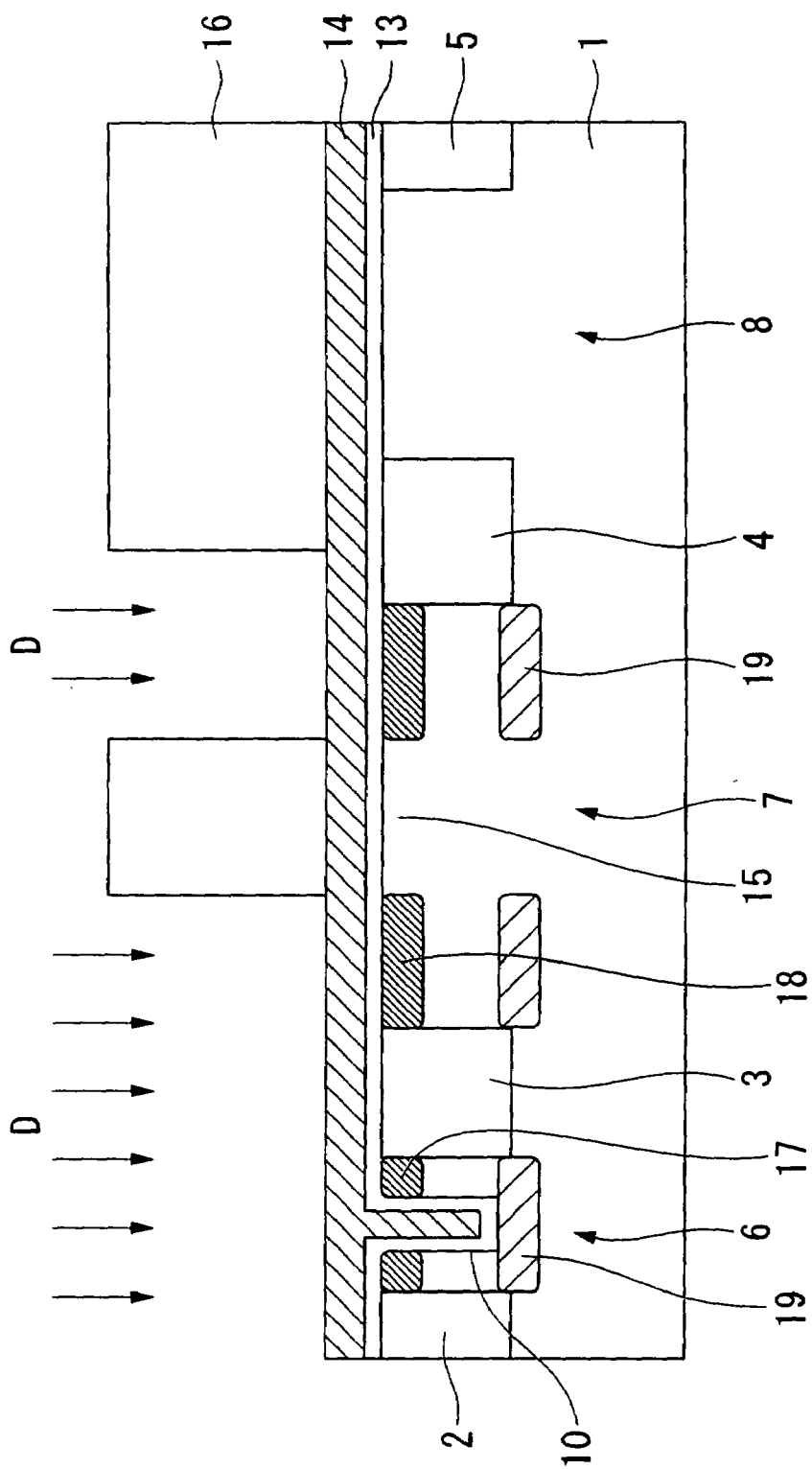
FIG. 1 is a cross-sectional view showing an example of the method of manufacturing a semiconductor device of the present invention.
Figure 2:
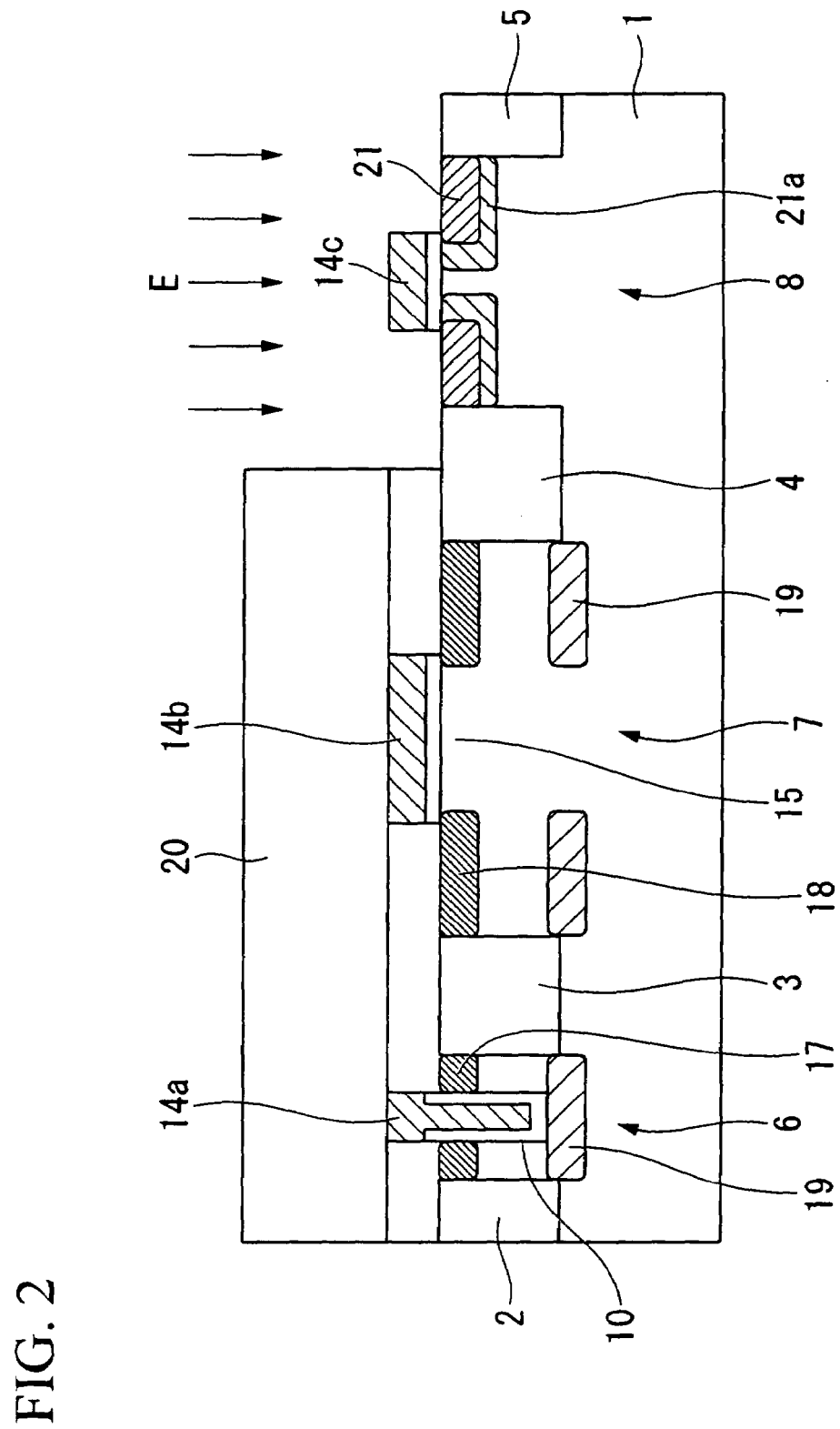
FIG. 2 is a cross-sectional view showing an example of the method of manufacturing a semiconductor device of the present invention that is performed after the step shown in FIG. 1.
Figure 3:
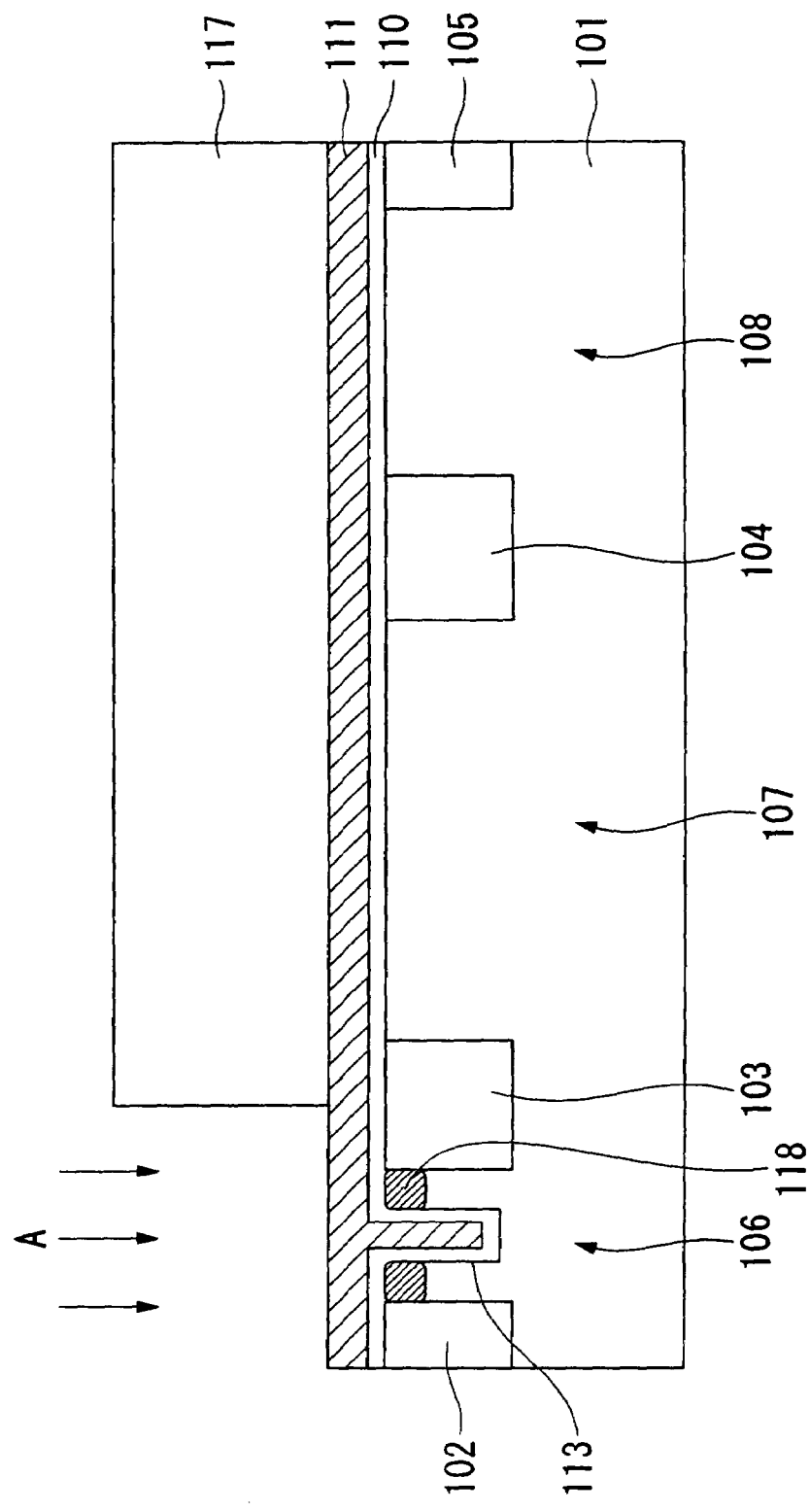
FIG. 3 is a cross-sectional view showing an example of a conventional method of manufacturing a semiconductor device.
Figure 4:
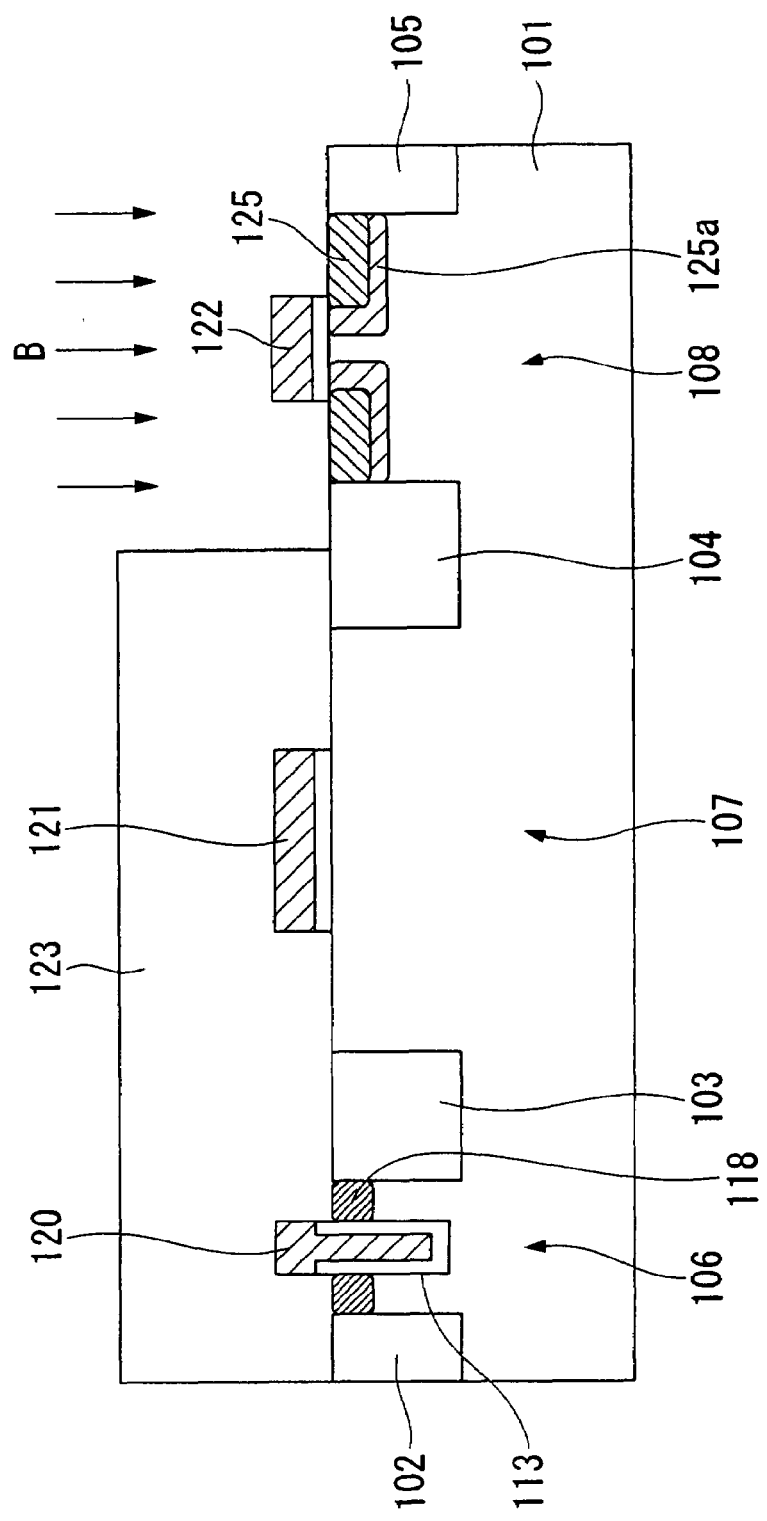
FIG. 4 is a cross-sectional view showing an example of the conventional method of manufacturing a semiconductor device that is performed after the step shown in FIG. 3.
Figure 5:
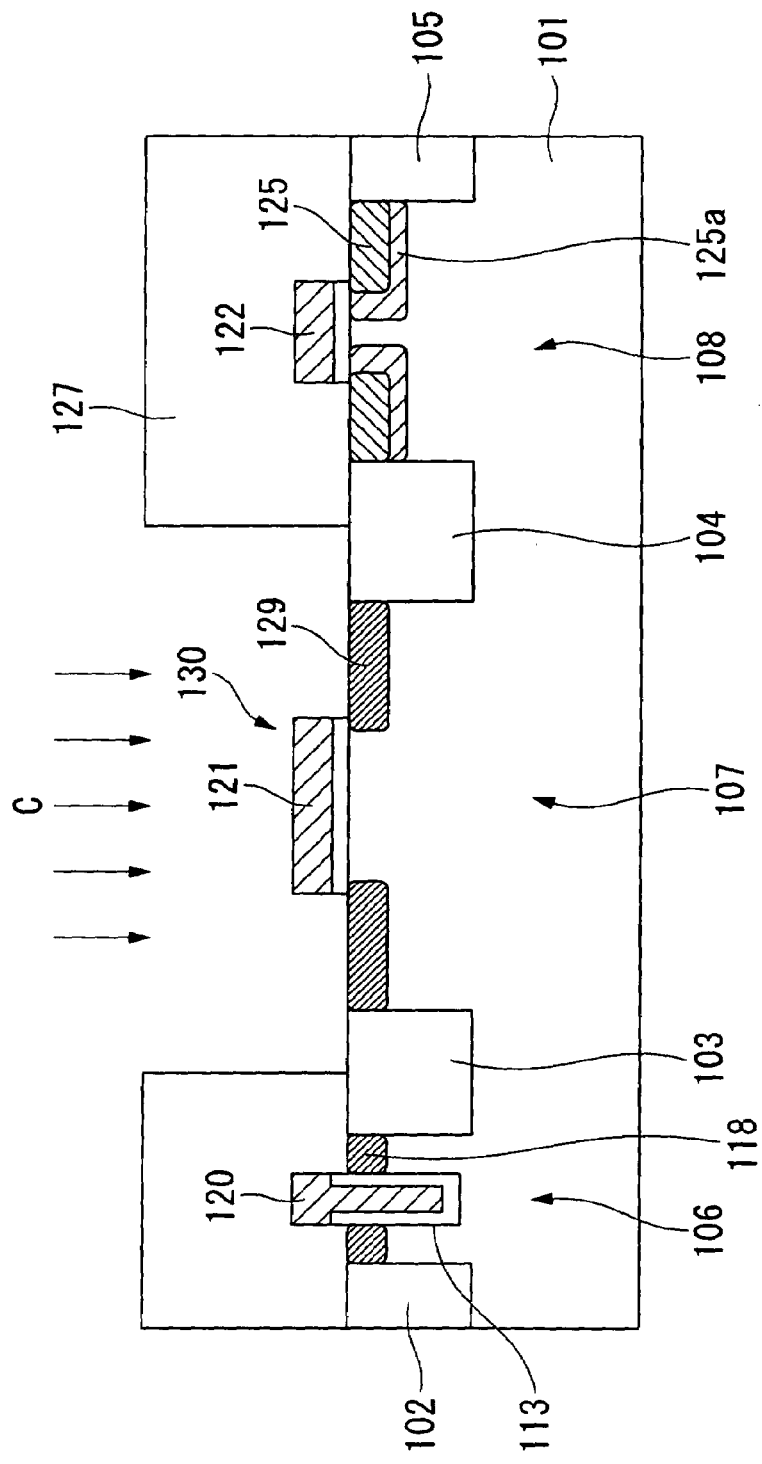
FIG. 5 is a cross-sectional view showing an example of the conventional method of manufacturing a semiconductor device that is performed after the step shown in FIG. 4.

FIG. 1 and FIG. 2 are drawings for describing the method of manufacturing a semiconductor device according to the present invention. Here, the description shall be given using a dynamic random access memory (DRAM) as an example. First, element isolations layers 2, 3, 4, 5 of a depth of about 250 nm are formed by the shallow trench isolation (STI) method or the like on the surface of a P-type semiconductor substrate 1. Note that from the left in the drawings are shown a cell transistor region 6, a high breakdown voltage transistor region (high breakdown voltage NMOS region) 7, and an ordinary breakdown voltage region (ordinary NMOS region) 8. Also, for the purpose of simplification, each single transistor in the cell transistor region, the high breakdown voltage NMOS region, and the ordinary NMOS region that does not withstand a high voltage is illustrated as being adjoined, while a P-channel MOS (PMOS) region that is generally considered to exist and another cell transistor that is disclosed as forming a pair with the one cell transistor are not illustrated.

Then, a trench 10 of a depth of for example 200 nm for trench-type cell formation is formed in the trench-type cell transistor region 6. Next, after a suitable channel implantation is performed on the substrate surface in the transistor regions 7 and 8, a gate insulating film 13 is formed on the surface portion of the semiconductor substrate 1 by a method such as thermal oxidation. Note that the gate insulating film 13 is also formed in the interior portion of the trench 10.

Then, a trench 10 of a depth of for example 200 nm for trench-type cell transistor formation is formed in the cell transistor region 6 using photolithography and dry etching technology. Next, after a suitable channel implantation is performed on the substrate surface in the transistor regions 7 and 8, a gate insulating film 13 is formed on the surface portion of the semiconductor substrate 1 including the interior portion of the trench 10 by a method such as thermal oxidation or the like.

Next, a gate material layer 14 consisting of phosphorus-doped polysilicon is formed to a thickness of 100 nm and concentration of $2\times10^{20}$ ions/cm$^3$ on the gate insulating film 13. Here, the gate material layer 14 is formed so as to fill up the inside of the trench 10.

Then, the entire ordinary breakdown voltage region 8 and only a channel region 15 of the high breakdown voltage transistor region 7 are covered with a photoresist layer 16 using photolithography technology. In other words, the photoresist layer 16 is formed at least on regions excluding the portions that become extension regions of the trench-type cell transistor region 6 and the high breakdown voltage transistor region 7 (extension region formation portions). Note that in FIG. 1, the entirety of the trench-type cell transistor region 6 and the entirety of the high breakdown voltage transistor region 7 except for the channel region 15 are open, and the other portions are covered by the photoresist layer 16. However, provided the extension region formation portion of the trench-type cell transistor in the trench-type cell transistor region 6 and the extension region formation portion of the high breakdown voltage transistor region 7 are open without being covered by the photoresist 16, portions other than these may be entirely covered by the photoresist 16. FIG. 1 shows an example of the entire ordinary breakdown voltage region 8 and only the channel region 15 of the high breakdown voltage transistor region 7 covered with the photoresist layer 16 in this concept.

When the photoresist layer 16 has been formed, next, boron (B) for Vt control of the trench-type transistor that is provided in the trench-type cell transistor region 6 is implanted at an energy of 70 KeV with a dose of $5\times10^{12}$ ions/cm$^2$ as shown by the arrows D in FIG. 1. After that, for example, phosphorus (P) is implanted at an energy of 80 KeV with a dose of $5\times10^{12}$ ions/cm$^2$ to form the extension region 17 of the trench-type cell transistor region 6. Here, even in the high breakdown voltage transistor region 7, it is possible to form the extension region (N$^-$ region) 18 simultaneously. In this step, it is possible to simultaneously form the extension regions 17, 18 in the trench-type cell transistor region 6 and the high breakdown voltage transistor region 7, respectively, with one step.

Note that in the present embodiment, since the boron implantation acts only in the direction of increasing the impurity density of the P-type semiconductor substrate 1 in the high breakdown voltage transistor region 7, there is no particular impact on the semiconductor substrate 1. This state is shown by the reference numeral 19 in FIG. 1.

Note that in the present embodiment, for example the high breakdown voltage transistor means a cell transistor that is made to run at a high voltage in order to blow an antifuse, and an ordinary breakdown voltage transistor means a transistor that is otherwise generally used. Also, since the gate of a cell transistor is an NMOS transfer gate, a voltage that is comparatively higher than the external voltage is used. However, the transistor for driving the gate of this cell transistor may be the high breakdown voltage transistor referred to in the present invention. Needless to say, a plurality of combinations is also possible depending on the situation.

Next, the gate material layer 14 is patterned so as to become a desired pattern, whereby gate electrodes 14a, 14b, 14c are formed, and then a photoresist layer 20 is formed so as to expose only the ordinary breakdown voltage transistor region 8 using photolithography technology. Ion implantation as shown by the arrows E in FIG. 2 is performed from above the substrate 1 onto the ordinary breakdown voltage transistor region 8 to form an extension region 21 in the ordinary breakdown voltage transistor region 8. Note that a P-type diffusion layer region 21a is also formed by Halo (Pocket) implantation that is generally used.

Figure 6:
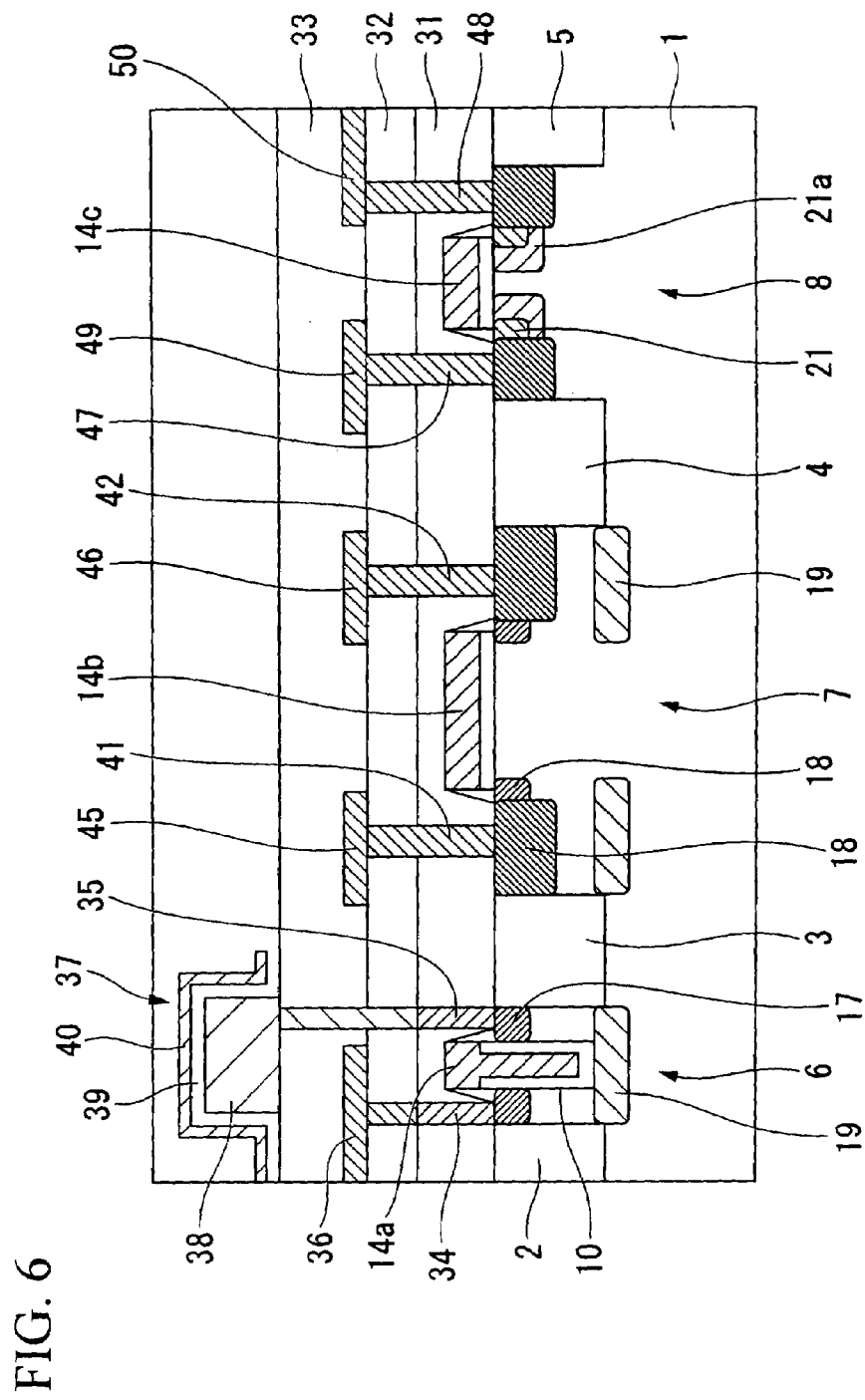
FIG. 6 is a cross-sectional view showing an example of the method of manufacturing a semiconductor device of the present invention that is performed after the step shown in FIG. 2.

In the subsequent steps, a sidewall is formed on the gate side wall, an N$^+$ diffusion layer is formed on the source/drain of the NMOS regions other than the trench-type cell transistor, and an upper insulating film, contact, and upper wiring and the like are suitably formed so that it is possible to obtain the example structure of the semiconductor device shown in FIG. 6.

In the example structure of the semiconductor device shown in FIG. 6, the elements that are the same as the constituent elements described in the above embodiment are denoted by the same reference numerals, with descriptions thereof omitted.

In the structure of this example, an interlayer insulating film 31 is formed covering the gate electrodes 14a, 14b, 14c that are formed on the semiconductor substrate 1, and a second interlayer insulating film 32 and a third interlayer insulating film 33 are laminated thereon. Contact plugs 34, 35 that vertically pass through the first interlayer insulating film 31 are formed on the extension regions 17, 17 of the gate electrode 14a, with one contact plug 34 being extended to connect to a wiring portion 36 of a bit wiring that is formed on the second interlayer insulating film 32, and the other contact plug 35 being extended to connect to a capacitor portion 37 that is provided on the third interlayer insulating film 33. In the structure of this example, the capacitor portion 37 has a capacitor structure that consists of a lower electrode 38, a capacitor insulating film 39, and an upper electrode 40.

Also, the extension regions 18, 18 of the gate electrode 14b are connected to wiring portions 45, 46 that are formed on the second interlayer insulating film 32 by contact plugs 41, 42 that pass through the first and second interlayer insulating films 31, 32. The extension regions 21, 21 of the gate electrode 14c are connected to wiring portions 49, 50 that are formed on the second interlayer insulating film 32 by contact plugs 47, 48 that pass through the first and second interlayer insulating films 31, 32.

The semiconductor device of this example configuration is constituted so as to be capable of performing a memory operation in correspondence with the charge quantity of the capacitor portion 37 that changes in correspondence with the level of the electrical potential of the wiring portion 36 that is a bit wiring and the electrical potential of the gate electrode that is a portion of the word wiring.

Note that in order to simplify the description in the present embodiment, only the case of forming NMOS regions on a PMOS substrate in a DRAM was described. However, it is of course possible to manufacture a semiconductor device in the same manner as described in FIG. 1 and FIG. 2 in another product besides a DRAM. Also, it is needless to say that by changing the type of ion to be implanted in the case of forming PMOS regions on an NMOS substrate, it is possible to manufacture a semiconductor device in the same manner.

The manufacturing method of the present invention is suitable for a semiconductor device that has a trench-type transistor.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of manufacturing a semiconductor device in which a trench-type transistor, a high breakdown voltage transistor, and an ordinary breakdown voltage transistor are provided on a semiconductor substrate, comprising the steps of:

forming element isolation layers on a surface of a semiconductor substrate for isolating a trench-type transistor, a high breakdown voltage transistor, and an ordinary breakdown voltage transistor;

forming a trench in a trench-type transistor region;

forming a gate insulating film and a gate material layer on the semiconductor substrate and in the trench;

forming a first photoresist layer on the semiconductor substrate so as to expose extension region formation portions of the trench-type transistor region and the high breakdown voltage transistor region;

forming extension regions of the trench-type transistor and the high breakdown voltage transistor by performing ion implantation in the trench-type transistor region and the high breakdown voltage transistor region;

forming a second photoresist layer on the semiconductor substrate so as to cover the trench-type transistor region and the high breakdown voltage transistor region and expose the ordinary breakdown voltage transistor region; and forming extension regions of the ordinary breakdown voltage transistor by implanting ions in the ordinary breakdown voltage transistor region.

2. The method of manufacturing a semiconductor device according to claim 1, wherein ion implantation is performed in the extension region formation portions after covering the ordinary breakdown voltage transistor region and a channel portion of the high breakdown voltage transistor region with a photoresist layer.

3. The method of manufacturing a semiconductor device according to claim 1, wherein gate electrodes are formed by patterning the gate insulating film and the gate material layer after forming the extension regions in the trench-type transistor region and the high breakdown voltage transistor region.

* * * * *